(12) United States Patent
Jin et al.

(10) Patent No.: US 8,243,485 B2
(45) Date of Patent: Aug. 14, 2012

(54) SEMICONDUCTOR APPARATUS AND CHIP SELECTION METHOD THEREOF

(75) Inventors: Sin Hyun Jin, Ichon-si (KR); Jong Chern Lee, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 410 days.

(21) Appl. No.: 12/650,501

(22) Filed: Dec. 30, 2009

(65) Prior Publication Data
US 2011/0102065 A1 May 5, 2011

(30) Foreign Application Priority Data
Oct. 29, 2009 (KR) .................. 10-2009-0103597

(51) Int. Cl.
*G11C 5/02* (2006.01)
(52) U.S. Cl. ............ 365/51; 257/774; 257/777; 365/63; 365/230.06
(58) Field of Classification Search .................. None
See application file for complete search history.

(56) References Cited

U.S. PATENT DOCUMENTS

| | | | |
|---|---|---|---|
| 5,943,254 A * | 8/1999 | Bakeman et al. ............... 365/72 | |
| 6,469,375 B2 * | 10/2002 | Beausoleil et al. ........... 257/686 | |
| 6,624,506 B2 * | 9/2003 | Sasaki et al. .................. 257/686 | |
| 6,740,981 B2 * | 5/2004 | Hosomi ........................ 257/778 | |
| 7,111,149 B2 | 9/2006 | Eilert | |
| 7,286,384 B2 * | 10/2007 | Wendt et al. .................... 365/63 | |
| 7,446,420 B1 * | 11/2008 | Kim .............................. 257/777 | |
| 7,494,846 B2 * | 2/2009 | Hsu et al. ...................... 438/109 | |
| 7,564,123 B1 | 7/2009 | Wang et al. | |
| 7,598,617 B2 | 10/2009 | Lee et al. | |
| 7,768,114 B2 * | 8/2010 | Choi ............................. 257/686 | |
| 7,863,960 B2 * | 1/2011 | Wang et al. ................... 327/291 | |
| 2005/0082664 A1 * | 4/2005 | Funaba et al. ................ 257/724 | |
| 2009/0091962 A1 | 4/2009 | Chung et al. | |
| 2009/0237970 A1 | 9/2009 | Chung | |
| 2011/0102066 A1 * | 5/2011 | Jin et al. ........................ 327/524 | |

* cited by examiner

*Primary Examiner* — Alexander Sofocleous
(74) *Attorney, Agent, or Firm* — William Park & Associates Ltd.

(57) ABSTRACT

A semiconductor apparatus having a plurality of stacked chips includes: a plurality of latch units, each of which is disposed in a corresponding one of the plurality of chips and is configured to latch a clock signal and a frequency-divided signal at mutually different points of time to generate an chip identification signal of the corresponding one of the plurality of chips; and a plurality of chip selection signal generating units, each of which is disposed in the corresponding one of the plurality of chips and is configured to compare the chip identification signal of the corresponding one of the plurality of chips with a chip selection identification signal to generate a chip selection signal of the corresponding one of the plurality of chips, wherein the chip selection signal is configured to enable the corresponding one of the plurality of chips when the chip identification signal matches the chip selection identification signal.

23 Claims, 3 Drawing Sheets

US 8,243,485 B2

SEMICONDUCTOR APPARATUS AND CHIP SELECTION METHOD THEREOF

CROSS-REFERENCE TO RELATED APPLICATION

The present application claims priority under 35 U.S.C. §119(a) to Korean Application No. 10-2009-0103597, filed on Oct. 29, 2009, which is incorporated by reference in its entirety as if set forth in full.

BACKGROUND

1. Technical Field

Various aspects of the present disclosure generally relate to a semiconductor apparatus, and more particularly, to a chip selection method for the semiconductor apparatus.

2. Related Art

In an effort to increase an integration density of a semiconductor apparatus, a three-dimensional (3D) semiconductor apparatus that stacks and packages a plurality of chips into a single package is recently being developed. Since the 3D semiconductor apparatus includes multiple chips in a single device, the 3D semiconductor apparatus is configured such that an electrical signal can distinguish each of the plurality of chips from other chips and select a specific chip from the plurality of chips.

FIG. 1 is a diagram showing a configuration of a conventional semiconductor apparatus that comprises a related-art chip selection circuit. As shown in FIG. 1, three chips Chip1, Chip2 and Chip3 constituting the semiconductor apparatus are stacked one on top of another, but are not in exactly vertical alignment. Each of the chips Chip1 to Chip3 comprises separate chip selection pins (or pads) 1 and 2 to receive chip selection signals. Each of the chips Chip1 to Chip3 is applied with two voltages, e.g., an external voltage VDD and a ground voltage VSS through the two chip selection pins 1 and 2. Therefore, a specific chip can be selected from the three chips Chip1 to Chip3 based on the two voltages VDD and VSS applied. As shown in FIG. 1, since the related-art semiconductor apparatus includes the two chip selection pins 1 and 2, four chip selections are possible at the maximum.

However, since the related-art semiconductor apparatus is required to be equipped with separate chip selection pins as described, it is difficult to secure a surface area for the chip selection pins which strictly limits the number of available chip selections. In addition, since separate wire connections are needed to provide the voltages VDD and VSS to the chip selection pins, a complex wiring structure is necessary. Furthermore according to the related art, since the chips are stacked in the vertically non-aligned pattern, a package structure is complicated and packaging the plurality of chips into the single package is difficult.

SUMMARY OF THE INVENTION

Accordingly, there is a need for an improved semiconductor memory apparatus and a related chip selection method that may overcome one or more of the problems discussed above. Therefore, various aspects of the present invention may provide a semiconductor apparatus and an associated chip selection method that are capable of generating chip selection signals by using a through silicon via (TSV).

To attain the advantages and in accordance with the purposes of the invention, as embodied and broadly described herein, one exemplary aspect of the invention may provide a semiconductor apparatus having a plurality of chips, comprising: a plurality of latch units, each of which is disposed in a corresponding one of the plurality of chips and is configured to latch a clock signal and a frequency-divided signal at mutually different points of time to generate a chip identification signal of the corresponding one of the plurality of chips, wherein the frequency-divided signal is generated by frequency-dividing the clock signal, and the clock signal and the frequency-divided signal are transmitted via a plurality of through silicon vias (TSVs); and a plurality of chip selection signal generating units, each of which is disposed in the corresponding one of the plurality of chips and is configured to compare the chip identification signal of the corresponding one of the plurality of chips with a chip selection identification signal to generate a chip selection signal of the corresponding one of the plurality of chips, wherein the chip selection signal enables the corresponding one of the plurality of chips when the chip identification signal matches the chip selection identification signal.

Another aspect of the present invention may provide a chip selection method for a semiconductor apparatus comprising: transmitting a clock signal and a frequency-divided signal to each of a plurality of chips via a plurality of TSVs and assigning a chip identifier to each of the plurality of chips, wherein the frequency-divided signal is generated by frequency-dividing the clock signal; and selecting a chip that is assigned with the chip identifier that matches a chip selection identifier.

Still another aspect of the present invention may provide, a semiconductor apparatus comprising: a first TSV configured to penetrate and couple first and second chips and configured to transmit a clock signal; a second TSV configured to penetrate and couple the first and second chips and configured to transmit a frequency-divided signal generated by frequency-dividing the clock signal; a first latch unit configured to latch levels of the clock signal and the frequency-divided signal to generate a chip identification signal of the first chip, at a first point of time; a first chip selection signal generating unit configured to generate a first chip selection signal when the chip identification signal of the first chip matches a chip selection identification signal; a second latch unit configured to latch levels of the clock signal and the frequency-divided signal to generate a chip identification signal of the second chip, at a second point of time; and a second chip selection signal generating unit configured to generate a second chip selection signal when the chip identification signal of the second chip matches the chip selection identification signal.

BRIEF DESCRIPTION OF THE DRAWINGS

The accompanying drawings, which are incorporated in and constitute a part of this specification, illustrate various aspects consistent with the invention and, together with the description, serve to explain the principles of the invention.

DETAILED DESCRIPTION OF THE PREFERRED EMBODIMENTS

Hereinafter, a semiconductor apparatus and a chip selection method thereof, according to the present invention, will be described below with reference to the accompanying drawings through preferred embodiments.

Figure 1:
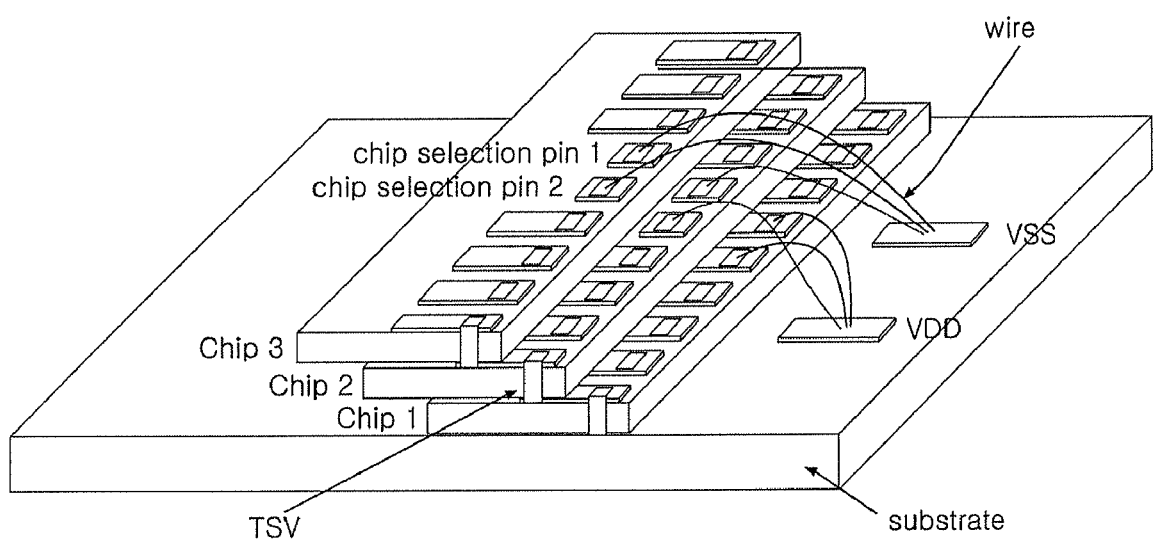
FIG. 1 is a diagram showing a configuration of semiconductor apparatus that comprises a related-art chip selection circuit.
Figure 2:
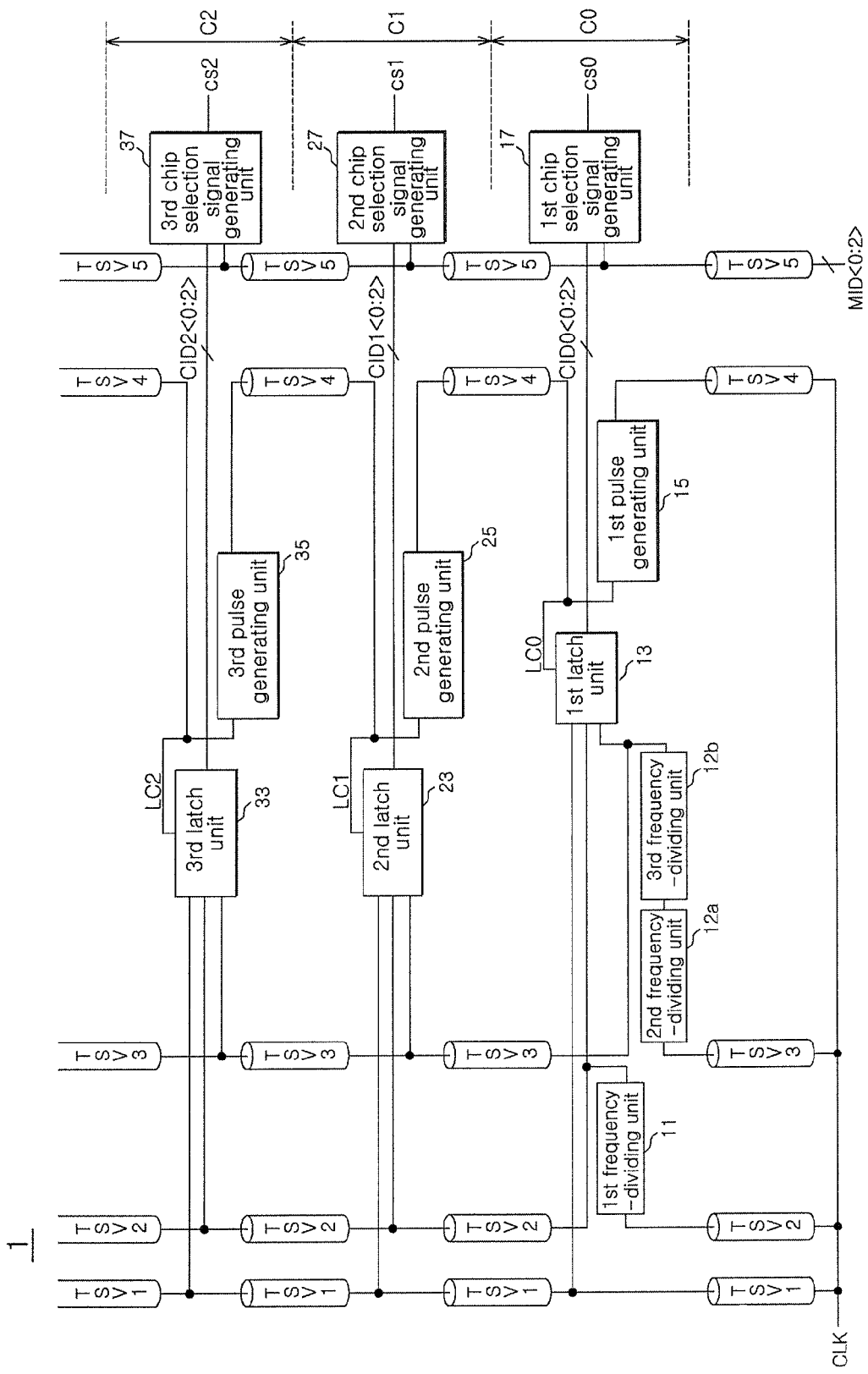
FIG. 2 is a block diagram schematically showing a configuration of a semiconductor apparatus according to the embodiment of the present invention.

FIG. 2 is a block diagram schematically showing a configuration of a semiconductor apparatus according to an embodiment of the invention. As shown in FIG. 2, a plurality of chips C0 to C2 are vertically stacked one on top of another to constitute the semiconductor apparatus 1. The plurality of stacked chips C0 to C2 are electrically connected to one another by a plurality of through silicon vias TSV1 to TSV5 penetrating the plurality of chips C0 to C2. In the embodiment, only three chips and only five TSVs are illustrated for convenience of description, but the number of stacked chips and the number of TSVs are not limited thereto, that is, the semiconductor apparatus 1 may include more stacked chips and more TSVs.

As shown in FIG. 2, the first to third TSVs TSV1 to TSV3 receive a clock signal CLK. The clock signal CLK is respectively transmitted to the first to third chips C0 to C2 via the first TSV TSV1. The first chip C0 includes a first frequency-dividing unit 11. The first frequency-dividing unit 11 can be implemented with a conventional frequency-divider configured to double the period of an input signal. The first frequency-dividing unit 11 is disposed in the first chip C0, and is coupled in series to the second TSV TSV2. Here, the first chip C0 which contains the first frequency-dividing unit 11 serves as a main chip for the remaining chips. Therefore, the first frequency-dividing unit 11 receives the clock signal CLK to generate a first frequency-divided signal having twice the period of the clock signal CLK. The first frequency-divided signal is transmitted to the second and third chips C1 and C2 respectively via the second TSV TSV2.

Second and third frequency-dividing units 12a and 12b may also be disposed in the first chip C0, and coupled in series to the third TSV TSV3. The respective second and third frequency-dividing units 12a and 12b can also be implemented with conventional frequency-dividers configured to double the period of their input signals. Since the second and third frequency-dividing units 12a and 12b are coupled in series to each other, the third frequency-dividing unit 12b can generate a second frequency-divided signal having four times the period of the clock signal CLK. The second frequency-divided signal is also transmitted to the respective second and third chips C1 and C2 via the third TSV TSV3.

The first to third frequency-dividing units 11, 12a and 12b constitute a clock generating unit disposed in the first chip C0, and the first and second frequency-divided signals, generated from the first chip C0, and the clock signal CLK are transmitted to the respective first to third chips C0 to C2 via the first to third TSVs TSV1 to TSV3.

The first to third chips C0 to C2 include first to third latch units 13, 23 and 33, respectively. The first latch unit 13 receives the clock signal CLK, the first frequency-divided signal and the second frequency-divided signal from the first TSV TSV1, an output terminal of the first frequency-dividing unit 11 and an output terminal of the third frequency-dividing unit 12b, respectively, and latches levels of the clock signal CLK, the first and second frequency-divided signals at a first point of time. The second latch unit 23 receives the clock signal CLK, and the first and second frequency-divided signals from the first to third TSVs TSV1 to TSV3, respectively, and latches levels of the clock signal CLK, and the first and second frequency-divided signals at a second point of time. Likewise, the third latch unit 33 receives the clock signal CLK, and the first and second frequency-divided signals from the first to third TSVs TSV1 to TSV3, respectively, and latches levels of the clock signal CLK, and the first and second frequency-divided signals at a third point of time.

The first to third points of time are determined by the fourth TSV TSV4 and first to third pulse generating units 15, 25 and 35 which are respectively included in the first to third chips C0 to C2. The first to third pulse generating units 15, 25 and 35 of the first to third chips C0 to C2 are coupled in series to the fourth TSV TSV4 in the first to third chips C0 to C2, respectively. The first pulse generating unit 15 is disposed in the first chip C0 and receives the clock signal CLK via the fourth TSV TSV4. The first pulse generating unit 15 can generate a pulse LC0 which is enabled by delaying the received clock signal CLK by a predetermined time. The predetermined time can be, for example, equal to or greater than $3/2$ the period of the clock signal CLK, but the embodiment is not intended to be limited thereto. The second pulse generating unit 25 disposed in the second chip C1 and the third pulse generating unit 35 disposed in the third chip C2 can respectively generate pulses LC1 and LC2 by delaying their input signals by, for example, a single period of the clock signal CLK. Therefore, the output signal LC0 of the first pulse generating unit 15 can be enabled at a certain point of time when the clock signal CLK is delayed by a period of time equal to or greater than $3/2$ the period of the clock signal CLK. Then, the output signal LC1 of the second pulse generating unit 25 can be enabled at a certain point of time when the clock signal CLK is delayed by a period of time equal to or greater than $5/2$ the period of the clock signal CLK because the second pulse generating unit 25 receives the output signal LC0 of the first pulse generating unit 15 via the fourth TSV TSV4. Then, the output signal LC2 of the third pulse generating unit 35 can be enabled at a certain point of time when the clock signal CLK is delayed by a period of time equal to or greater than $7/2$ the period of the clock signal CLK because the third pulse generating unit 35 receives the output signal LC1 of the second pulse generating unit 25 via the fourth TSV TSV4.

Therefore, the first latch unit 13 can latch levels of the clock signal CLK, and the first and second frequency-divided signals in response to the pulse LC0 generated from the first pulse generating unit 15, and similarly, the second and third latch units 23 and 33 can respectively latch levels of the clock signal CLK, the first and second frequency-divided signals in response to the pulses LC1 and LC2 generated from the second and third pulse generating units 25 and 35.

Output signals of the first to third latch units 13, 23 and 33 respectively function as individual chip identification (ID) signals CID0<0:2> to CID2<0:2> of the first to third chips C0 to C2. The chip identification signals. CID0<0:2> to CID2<0:2> will now be described in detail.

The first to third chips C0 to C2 include first to third chip selection signal generating units 17, 27 and 37, respectively. The first to third chip selection signal generating units 17, 27 and 37 respectively receive the individual chip identification signals CID0<0:2> to CID2<0:2> of the first to third chips C0 to C2 and a chip selection identification signal MID<0:2> to generate first to third chip selection signals cs0 to cs2. In particular, the first chip selection signal generating unit 17 compares the chip identification signal CID0<0:2> of the first chip C0 with the chip selection identification signal MID<0:2> and enables the first chip selection signal cs0 if the chip identification signal CID0<0:2> matches the chip selection identification signal MID<0:2>. Similarly, the second chip selection signal generating unit 27 also compares the chip identification signal CID1<0:2> of the second chip C1 with the chip selection identification signal MID<0:2> and enables the second chip selection signal cs1 if the chip identification signal CID1<0:2> matches the chip selection identification signal MID<0:2>. Similarly, the third chip selection signal generating unit 37 also compares the chip identification signal C1D2<0:2> of the third chip C2 with the chip selection identification signal MID<0:2> and enables the third chip selection signal cs2 if the chip identification signal CID2<0:2> matches the chip selection identification signal MID<0:2>.

The chip selection identification signal MID<0:2> may be a command signal that identifies a chip to be selected among the plurality of chips C0 to C2. The chip selection identification signal MID<0:2> is inputted from outside of the semiconductor apparatus 1, but the embodiment is not intended to be limited thereto. For example, the chip selection identification signal MID<0:2> can be a signal that is inputted from a controller, coupled to the semiconductor apparatus 1 to select and enable a chip of the semiconductor apparatus 1. The first to third chip selection signals cs0 to cs2 are signals that can select and enable the chip to be selected and enabled by the controller. In addition, the chip selection identification signal MID<0:2> can be respectively transmitted to the first to third chip selection signal generating units 17, 27 and 37 of the first to third chips C0 to C2 via the fifth TSV TSV5.

Figure 3:
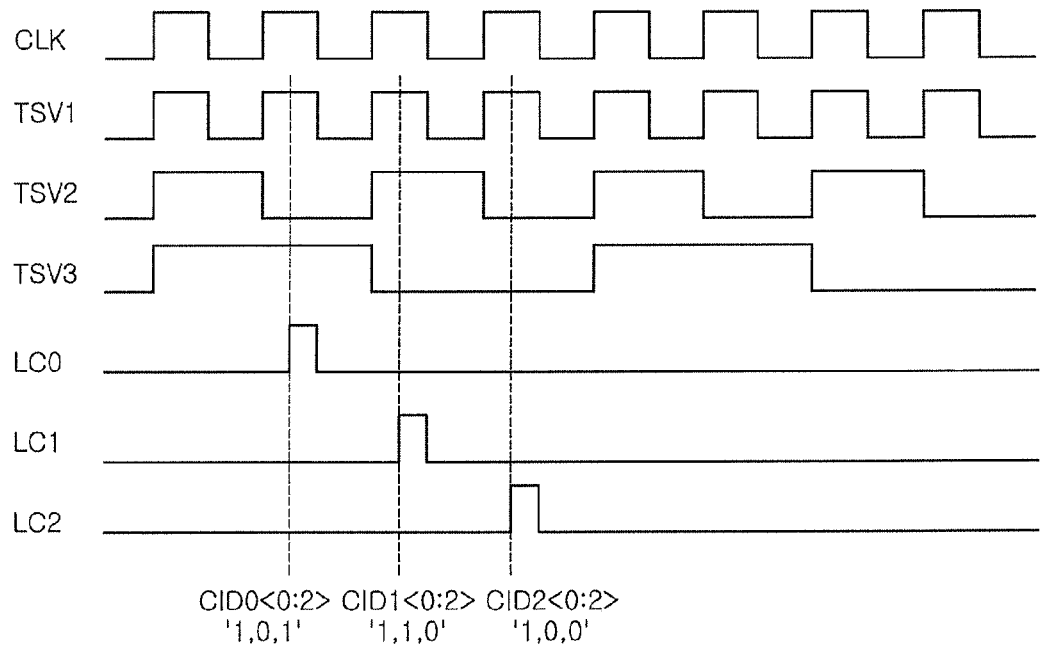
FIG. 3 is a timing diagram showing an operation of the semiconductor apparatus of FIG. 2 according to the embodiment.

FIG. 3 is a timing diagram showing an operation of the semiconductor apparatus 1 of FIG. 2 according to the embodiment. Referring to FIGS. 2 and 3, when the clock signal CLK is inputted, the clock signal CLK is transmitted to the first to third chips C0 to C2 via the first TSV TSV1. The first frequency-dividing unit 11 transmits the first frequency-divided signal having a half (½) frequency of that of the clock signal CLK via the second TSV TSV2. The second and third frequency-dividing units 12a and 12b transmit the second frequency-divided signal having a quarter (¼) frequency of that of the clock signal CLK via the third TSV TSV3. In FIG. 3, "TSV1", "TSV2" and "TSV3" respectively denote the clock signal CLK and the first and second frequency-divided signals transmitted via the first to third TSVs TSV1 to TSV3. The first pulse generating unit 15 receives the clock signal CLK to generate the pulse LC0 which is enabled at the point of time when the clock signal CLK is delayed by a period of time equal to or greater than 3/2 the period of the clock signal CLK, and the second and third pulse generating units 25 and 35 respectively generate the pulses LC1 and LC2 which are respectively enabled at the points of time when the clock signal CLK is delayed by periods of time equal to or greater than 5/2 and 7/2 of the period of the clock signal CLK respectively.

The first to third latch units 13, 23 and 33 respectively latch levels of the clock signal CLK transmitted via the first TSV TSV1, the first frequency-divided signal transmitted via the second TSV TSV2 and the second frequency-divided signal transmitted via the third TSV TSV3, in response to the pulses LC0 to LC2 generated from the first to third pulse generating units 15, 25 and 35. In FIG. 3, when the pulse LC0 is generated from the first pulse generating unit 15, the first latch unit 13 latches and outputs a logic level "1" of the clock signal CLK, a logic level "0" of the first frequency-divided signal, and a logic level "1" of the second frequency-divided signal. Therefore, a signal having a logic level "1, 0, 1" is assigned to the first chip C0 as its chip identification signal CID0<0:2>. Afterwards, when the pulse LC1 is generated from the second pulse generating unit 25, the second latch unit 23 latches and outputs the logic level "1" of the clock signal CLK, a logic level "1" of the first frequency-divided signal, and a logic level "0" of the second frequency-divided signal. Therefore, a signal having a logic level "1, 1, 0" is assigned to the second chip C1 as its chip identification signal CID1<0:2>. Afterwards, when the pulse LC2 is generated from the third pulse generating unit 35, the third latch unit 33 latches and outputs the logic level "1" of the clock signal CLK, the logic level "0" of the first frequency-divided signal, and the logic level "0" of the second frequency-divided signal. Therefore, a signal having a logic level "1, 0, 0" is assigned to the third chip C2 as its chip identification signal CID2<0:2>.

In this way, mutually different chip IDs can be assigned to the plurality of stacked chips in such a configuration of the semiconductor apparatus 1 of FIG. 2. In the embodiment, since each of the chip identification signals CID0<0:2> to CID2<0:2> is a 3-bit signal, the mutually different individual IDs can be assigned to eight chips at maximum. Although it is illustrated that each of the chip identification signals is a 3-bit signal, the embodiment is not intended to be limited thereto, and it will apparent to those skilled in the art that an chip identification signal having equal to or greater than 4 bits can be generated by using more TSVs.

Figure 4:
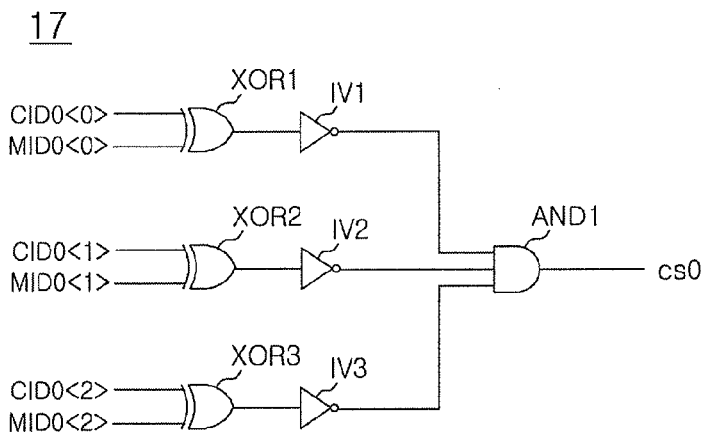
FIG. 4 is a diagram showing a configuration of an embodiment of a first chip selection signal generating unit of FIG. 2.

FIG. 4 is a diagram showing a configuration of an embodiment of the first chip selection signal generating unit 17 in FIG. 2. As shown in FIG. 4, the first chip selection signal generating unit 17 comprises first to third XOR gates XOR1 to XOR3, first to third inverters IV1 to IV3, and a first AND gate AND1. The first XOR gate XOR1 receives the first bit. CID0<0> of the chip identification signal CID0<0:2> of the first chip C0 and the first bit MID<0> of the chip selection identification signal MID<0:2>. Similarly, the second XOR gate XOR2 receives the second bit CID0<1> of the chip identification signal CID0<0:2> of the first chip C0 and the second bit MID<1> of the chip selection identification signal MID<0:2>, and the third XOR gate XOR3 receives the third bit CID0<2> of the chip identification signal CID0<0:2> of the first chip C0 and the third bit MID<2> of the chip selection identification signal MID<0:2>. The first to third XOR gates XOR1 to XOR3 respectively output a logic low level signal when the bits of the received chip identification signal CID0<0:2> respectively match the corresponding bits of the received chip selection identification signal MID<0:2>. The first to third inverters IV1 to IV3 invert outputs of the first to third XOR gates XOR1 to XOR3, respectively. The first AND gate AND1 receives outputs of the first to third inverters IV1 to IV3 to generate the first chip selection signal cs0. Therefore, the first chip selection signal generating unit 210 enables the first chip selection signal cs0 only when all of the bits of the received chip identification signal CID0<0:2> match the corresponding bits of the received chip selection identification signal MID<0:2>. Herein, the second and third chip selection signal generating units 27 and 37 have substantially the same configuration and function as the first chip selection signal generating unit 17.

The first to third chip selection signal generating units 17, 27 and 37 can respectively enable the first to third chip selection signals cs0 to cs2 when the corresponding chip identification signals CID0<0:2> to CID2<0:2> of the first to third chips C0 to C2 respectively match the chip selection identification signal MID<0:2>. For example, if the controller applies the chip selection identification signal MID<0:2> having the logic level "1, 0, 0", only the third chip selection signal cs2 is enabled, and thus only the third chip C2 is enabled, and if the controller applies the chip selection identification signal MID<0:2> having the logic level "1, 1, 0", only the second chip selection signal cs1 is enabled, and thus only the second chip C1 is enabled. Therefore, of the first to third chips C0 to C2, a specific chip can be selected and enabled based on a logic level of the chip selection identification signal MID<0:2> applied from the controller.

According to the embodiment, it is unnecessary for the semiconductor apparatus to include the separate wire in order to select one chip from the plurality of stacked chips and the mutually different chip ID can be assigned to each of the plurality of stacked chips by using the TSV, and the chip selection signal can be enabled based on whether the chip ID matches the chip selection ID. Therefore, all of the plurality of chips can be stacked in vertical alignment, thereby making it easy to secure the surface area of the chip constituting the semiconductor apparatus and simplifying the package structure.

While certain aspects and/or embodiments of the invention have been described above, it will be understood to those skilled in the art that the aspects/embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A semiconductor apparatus having a plurality of chips, comprising:
   a plurality of latch units, each of which is disposed in a corresponding one of the plurality of chips and is configured to latch a clock signal and a frequency-divided signal at mutually different points of time to generate a chip identification signal of the corresponding one of the plurality of chips, wherein the frequency-divided signal is generated by frequency-dividing the clock signal, and the clock signal and the frequency-divided signal are transmitted via a plurality of through silicon vias (TSVs); and
   a plurality of chip selection signal generating units, each of which is disposed in the corresponding one of the plurality of chips and is configured to compare the chip identification signal of the corresponding one of the plurality of chips with a chip selection identification signal to generate a chip selection signal of the corresponding one of the plurality of chips,
   wherein the chip selection signal enables the corresponding one of the plurality of chips when the chip identification signal matches the chip selection identification signal.

2. The semiconductor apparatus of claim 1, wherein the semiconductor apparatus further comprises a plurality of pulse generating units, each of which is disposed in the corresponding one of the plurality of chips, and is configured to be coupled in series to another TSV that receives the clock signal and to generate a pulse that determines a latch point of time of the latch unit of the corresponding one of the plurality of chips.

3. The semiconductor apparatus of claim 1, wherein the chip selection identification signal is a command signal which is applied from outside of the semiconductor apparatus.

4. The semiconductor apparatus of claim 1, wherein the chip selection identification signal is transmitted to each of the plurality of chip selection signal generating units via another TSV.

5. A chip selection method for a semiconductor apparatus comprising:
   transmitting a clock signal and a frequency-divided signal to each of a plurality of chips via a plurality of TSVs and assigning a chip identifier to each of the plurality of chips, wherein the frequency-divided signal is generated by frequency-dividing the clock signal; and
   selecting a chip that is assigned with the chip identifier that matches a chip selection identifier.

6. The chip selection method of claim 5, wherein the transmitting a clock signal and a frequency-divided signal comprises:
   transmitting the clock signal and the frequency-divided signal via the plurality of TSVs; and
   latching levels of the clock signal and the frequency-divided signal at a predetermined point of time in each of the plurality of chips and generating the chip identifier.

7. The chip selection method of claim 5, wherein the frequency-divided signal is generated by a frequency-dividing unit which is disposed in a main chip and coupled in series to the TSV in the main chip.

8. The chip selection method of claim 6, wherein the latching levels of the clock signal and the frequency-divided signal comprises latching levels of the clock signal and the frequency-divided signal at mutually different points of time in each of the plurality of chips.

9. The chip selection method of claim 5, wherein the chip selection identifier is a command signal which is applied from outside of the semiconductor apparatus.

10. The chip selection method of claim 5, wherein the chip selection identifier is transmitted to each of the plurality of chips via another TSV.

11. A semiconductor apparatus comprising:
    a first TSV configured to penetrate and couple first and second chips and configured to transmit a clock signal;
    a second TSV configured to penetrate and couple the first and second chips and configured to transmit a frequency-divided signal generated by frequency-dividing the clock signal;
    a first latch unit configured to latch levels of the clock signal and the frequency-divided signal to generate a chip identification signal of the first chip, at a first point of time;
    a first chip selection signal generating unit configured to generate a first chip selection signal when the chip identification signal of the first chip matches a chip selection identification signal;
    a second latch unit configured to latch levels of the clock signal and the frequency-divided signal to generate a chip identification signal of the second chip, at a second point of time; and
    a second chip selection signal generating unit configured to generate a second chip selection signal when the chip identification signal of the second chip matches the chip selection identification signal.

12. The semiconductor apparatus of claim 11, wherein the first latch unit and the first chip selection signal generating unit are disposed in the first chip.

13. The semiconductor apparatus of claim 11, wherein the second latch unit and the second chip selection signal generating unit are disposed in the second chip.

14. The semiconductor apparatus of claim 11, wherein the first and second points of time are respectively determined by first and second pulse generating units, wherein the first and second pulse generating units are respectively disposed in the first and second chips, and are configured to be coupled in series to another TSV that receives the clock signal and to generate a pulse which is enabled after the clock signal is delayed by a predetermined period of the clock signal.

15. The semiconductor apparatus of claim 11, wherein the semiconductor apparatus further comprises a frequency-dividing unit which is disposed in the first chip, and is configured to be coupled in series to the second TSV and to frequency-divide the clock signal.

16. The semiconductor apparatus of claim 11, wherein the chip selection identification signal is a command signal which is applied from outside the semiconductor apparatus.

17. The semiconductor apparatus of claim 11, wherein the chip selection identification signal is transmitted to each of the first and second chip selection signal generating units via another TSV.

18. A semiconductor apparatus having a plurality of chips including a first chip, comprising:
- a clock generating unit disposed in the first chip which is configured to frequency-divide a clock signal to generate a frequency-divided signal and to transmit the clock signal and the frequency-divided signal via a plurality of TSVs;
- a plurality of latch units, each of which is disposed in a corresponding one of the plurality of chips and is configured to receive the clock signal and the frequency-divided signal to generate a chip identification signal of the corresponding one of the plurality of chips; and
- a plurality of chip selection signal generating units, each of which is disposed in the corresponding one of the plurality of chips and is configured to receive the chip identification signal of the corresponding one of the plurality of chips and the chip selection identification signal to generate a chip selection signal of the corresponding one of the plurality of chips.

19. The semiconductor apparatus of claim 18, wherein each of the plurality of latch units is configured to latch levels of the clock signal and the frequency-divided signal at mutually different points of time.

20. The semiconductor apparatus of claim 19, wherein each of the mutually different points of time is determined by corresponding one of a plurality of pulse generating units,
wherein the plurality of pulse generating units are respectively disposed in the plurality of chips and are configured to be coupled in series to another TSV that receives the clock signal and to generate a pulse which is enabled after the clock signal is delayed by a predetermined period of the clock signal.

21. The semiconductor apparatus of claim 18, wherein each of the plurality of chip selection signal generating units is configured to compare the chip identification signal of the corresponding one of the plurality of chips with the chip selection identification signal to generate the chip selection signal of the corresponding one of the plurality of chips,
wherein the chip selection signal is configured to enable the corresponding one of the plurality of chips when the chip identification signal matches the chip selection identification signal.

22. The semiconductor apparatus of claim 18, wherein the chip selection identification signal is a command signal which is applied from outside the semiconductor apparatus.

23. The semiconductor apparatus of claim 18 wherein the chip selection identification signal is transmitted to each of the plurality of chip selection signal generating units via another TSV.

* * * * *